United States Patent
Yu

(10) Patent No.: US 7,806,684 B2
(45) Date of Patent: Oct. 5, 2010

(54) METHOD OF SEMICONDUCTOR PROCESS AND SEMICONDUCTOR APPARATUS SYSTEM

(75) Inventor: Guang-You Yu, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 255 days.

(21) Appl. No.: 11/866,117

(22) Filed: Oct. 2, 2007

(65) Prior Publication Data

US 2009/0087807 A1    Apr. 2, 2009

(51) Int. Cl.
*F27D 3/00* (2006.01)
*F27D 5/00* (2006.01)

(52) U.S. Cl. ............................ 432/5; 432/247; 414/936

(58) Field of Classification Search ...................... 432/5, 432/253, 258, 247; 219/390, 405; 438/660, 438/663, 715, 758; 414/935–939
See application file for complete search history.

(56) References Cited

U.S. PATENT DOCUMENTS

| | | | | |
|---|---|---|---|---|
| 5,404,894 A * | 4/1995 | Shiraiwa | ....................... | 134/66 |
| 5,512,320 A * | 4/1996 | Turner et al. | ............ | 427/255.21 |
| 5,820,366 A * | 10/1998 | Lee | .............................. | 432/241 |
| 6,102,164 A * | 8/2000 | McClintock et al. | ......... | 187/267 |
| 6,270,306 B1 * | 8/2001 | Otwell et al. | ............ | 414/222.13 |
| 7,017,896 B2 * | 3/2006 | Sa | ................................ | 269/55 |
| 7,124,494 B2 * | 10/2006 | Sa | ................................ | 29/559 |
| 7,204,887 B2 * | 4/2007 | Kawamura et al. | ........... | 118/725 |
| 2003/0053893 A1 * | 3/2003 | Matsunaga et al. | ........... | 414/217 |
| 2008/0175693 A1 * | 7/2008 | Fujii | .......................... | 414/217 |
| 2008/0233661 A1 * | 9/2008 | Lu et al. | ........................ | 438/7 |
| 2009/0053023 A1 * | 2/2009 | Wakabayashi | .......... | 414/222.13 |

* cited by examiner

*Primary Examiner*—Gregory A Wilson
(74) *Attorney, Agent, or Firm*—WPAT, PC; Justin King

(57) ABSTRACT

A method of a semiconductor process is provided. The semiconductor process at least includes a first high temperature furnace process and a second high temperature furnace process. In the method, the first high temperature furnace process is performed on a first wafer boat carrying at least a wafer. Then, the second high temperature furnace process is performed on a second wafer boat carrying at least the same wafer. In addition, before the second high temperature furnace process is implemented, a moving step is performed, such that a relative position of the wafer in the first wafer boat is different from that of the wafer in the second wafer boat.

23 Claims, 5 Drawing Sheets

METHOD OF SEMICONDUCTOR PROCESS AND SEMICONDUCTOR APPARATUS SYSTEM

BACKGROUND OF THE INVENTION

1. Field of the Invention

The present invention relates to an integrated circuit (IC) apparatus and a manufacturing process thereof, and more particularly to a semiconductor apparatus system having a furnace apparatus and to a method of a semiconductor process including a furnace process.

2. Description of Related Art

During the fabrication of ICs, a lot of processes require a high temperature environment, such as a thermal diffusion process for doping ions, a thermal oxidation process for growing an oxidation layer, and an annealing process for eliminating defects.

The above-mentioned thermal treatment processes are usually implemented by disposing wafers on a wafer boat and transporting the same into a furnace for reactions. After the reactions are completed, the wafers are then taken out. Besides, when a next furnace process is performed, the same lot of the wafers disposed on the wafer boat is transported to a furnace again, and the wafers are also taken out after the reactions are completed.

In general, the internal wafer boat is partitioned into a plurality of grids (wafer slots) for carrying a plurality of the wafers. Each of the wafer slots has three pins disposed on a horizontal plane of the wafer boat. In detail, the wafers are in direct contact with the pins in the wafer boat and are fixedly placed in the wafer slots of the wafer boat due to support of the pins. Nevertheless, after an implementation of a high temperature furnace process, damages to contacting areas between the wafer boat and the wafers may arise. For example, material defects including dislocations and slips may occur on the wafers. Particularly, the contacting areas between the wafer boat and the wafers remain constant in different furnace processes. Therefore, after a plurality of the high temperature furnace processes is performed, the damages to the wafers may be increased because of the high temperature. As such, stability of subsequent manufacturing processes may be significantly reduced, even giving rise to a negative impact on reliability and yield of the devices and the products.

SUMMARY OF THE INVENTION

In view of the foregoing, the present invention is directed to a method of a semiconductor process. The method is capable of preventing a wafer from being severely damaged due to implementations of a plurality of high temperature furnace processes and stability and reliability of subsequent manufacturing processes can also be avoided from being deteriorated.

The present invention is further directed to a semiconductor apparatus system able to resolve issues regarding severe damages to a wafer due to implementations of a plurality of high temperature furnace processes. Thereby, stability of subsequent manufacturing processes, reliability of devices, and yield of the devices can all be improved.

The present invention provides a method of a semiconductor process. The semiconductor process includes at least a first high temperature furnace process and a second high temperature furnace process. In the method, the first high temperature furnace process is performed on a first wafer boat carrying at least a wafer. Then, the second high temperature furnace process is performed on a second wafer boat carrying at least the same wafer. In addition, before the second high temperature furnace process is implemented, a first moving step is performed, such that a relative position of the wafer in the first wafer boat is different from that of the wafer in the second wafer boat.

According to an embodiment of the present invention, in the method of the semiconductor process, the first moving step is performed by rotating the wafer at an angle on the same horizontal plane with use of a robot arm.

According to an embodiment of the present invention, in the method of the semiconductor process, the first moving step is performed by changing the relative positions of the wafer in the first wafer boat and in the second wafer boat with use of a positioning device in a furnace apparatus.

According to an embodiment of the present invention, in the method of the semiconductor process, the first moving step is performed by changing the relative positions of the wafer in the first wafer boat and on the second wafer boat through rotations of the first and the second wafer boats.

According to an embodiment of the present invention, in the method of the semiconductor process, a process temperature of the first high temperature furnace process and a process temperature of the second high temperature furnace process are larger than or equal to 900° C.

According to an embodiment of the present invention, the method of the semiconductor process further includes performing at least a low temperature furnace process after the first high temperature furnace process is performed but before the first moving step is performed.

According to an embodiment of the present invention, in the method of the semiconductor process, the first wafer boat comprises a boat body and a supporting part which are used to contact with wafers and disposed on each horizontal plane of the boat body, and the supporting part comprises a plurality of pins, a ring-shaped partition plate having an open hole at a side, or a ring-shaped partition plate having an open hole at a side and at least one opening. A material of the first wafer boat is, for example, quartz, silicon carbide (SiC), or any other appropriate material. In another embodiment, the second wafer boat and the first wafer boat are the same or different.

According to an embodiment of the present invention, the method of the semiconductor process further includes performing a wafer curvature measuring step before the first moving step is performed. A relative displacement amount of the wafer is determined upon a measured value obtained through performing the wafer curvature measuring step.

According to an embodiment of the present invention, the method of the semiconductor process further includes performing a third high temperature furnace process on a third wafer boat carrying at least the wafer after the second high temperature furnace process is implemented. In addition, a second moving step is performed before the third high temperature furnace process is implemented, such that the relative positions of the wafer in the first wafer boat, in the second wafer boat, and in the third wafer boat are different. Here, the second moving step and the first moving step are the same or different. Besides, at least a low temperature furnace process is performed after the second high temperature furnace process is performed but before the second moving step is performed. A process temperature of the third high temperature furnace process is larger than or equal to 900° C. The third wafer boat and the second wafer boat are the same or different. According to an embodiment of the present invention, the method of the semiconductor process further includes performing a wafer curvature measuring step before the second moving step is performed, and a relative displacement amount of the wafer is determined upon a measured value obtained through performing the wafer curvature measuring step.

The present invention further provides a semiconductor apparatus system including at least a furnace apparatus and a mobile control station. The furnace apparatus including a wafer boat for carrying at least a wafer is adopted to perform a high temperature furnace process. The mobile control station is coupled to the furnace apparatus for differentiating a relative position of the wafer in the wafer boat when different high temperature furnace processes are performed.

According to an embodiment of the present invention, the semiconductor apparatus system further includes a wafer curvature measuring station coupled to the furnace apparatus and the mobile control station for determining a relative displacement amount of the wafer based on a measured value.

According to an embodiment of the present invention, in the semiconductor apparatus system, the wafer is rotated at an angle on the same horizontal plane with use of a robot arm in the mobile control station.

According to an embodiment of the present invention, in the semiconductor apparatus system, the relative position of the wafer in the wafer boat is changed with use of a positioning device in the mobile control station.

According to an embodiment of the present invention, in the semiconductor apparatus system, the relative position of the wafer in the wafer boat is changed by rotating the wafer boat in the mobile control station.

According to an embodiment of the present invention, in the semiconductor apparatus system, a process temperature of the high temperature furnace process is larger than or equal to 900° C.

According to an embodiment of the present invention, in the semiconductor apparatus system, the wafer boat comprises a boat body and a supporting part which are used to contact with wafers and disposed on each horizontal plane of the boat body, and the supporting part comprises a plurality of pins, a ring-shaped partition plate having an open hole at a side, or a ring-shaped partition plate having an open hole at a side and at least one opening. A material of the wafer boat is, for example, quartz, silicon carbide (SiC), or any other appropriate material.

In the semiconductor apparatus system of the present invention, the mobile control station is additionally configured, so as to change the relative position of the wafer in the wafer boat. Thereby, the wafer can be prevented from being severely damaged due to the implementations of the high temperature furnace processes, and stability and reliability of the subsequent manufacturing processes can also be avoided from being adversely affected. Besides, the semiconductor apparatus system of the present invention further includes the wafer curvature measuring station for determining the relative displacement amount of the wafer based on the measured value and for improving stability and reliability of the manufacturing process. On the other hand, according to the method provided by the present invention, the relative position of the wafer in the wafer boat is changed before the next high temperature furnace process is performed, so as to avoid an increase in the severe damages to the wafer on account of the implementation of the previous high temperature furnace process. Moreover, the method provided by the present invention further includes the wafer curvature measuring step before the relative position of the wafer in the wafer boat is changed, and the relative displacement amount of the wafer is determined upon the measured value obtained through per-forming the wafer curvature measuring step. Hence, reliability and yield of the manufacturing process can be further enhanced.

In order to the make the aforementioned and other objects, features and advantages of the present invention comprehensible, several embodiments accompanied with figures are described in detail below.

DESCRIPTION OF EMBODIMENTS

Figure 1:
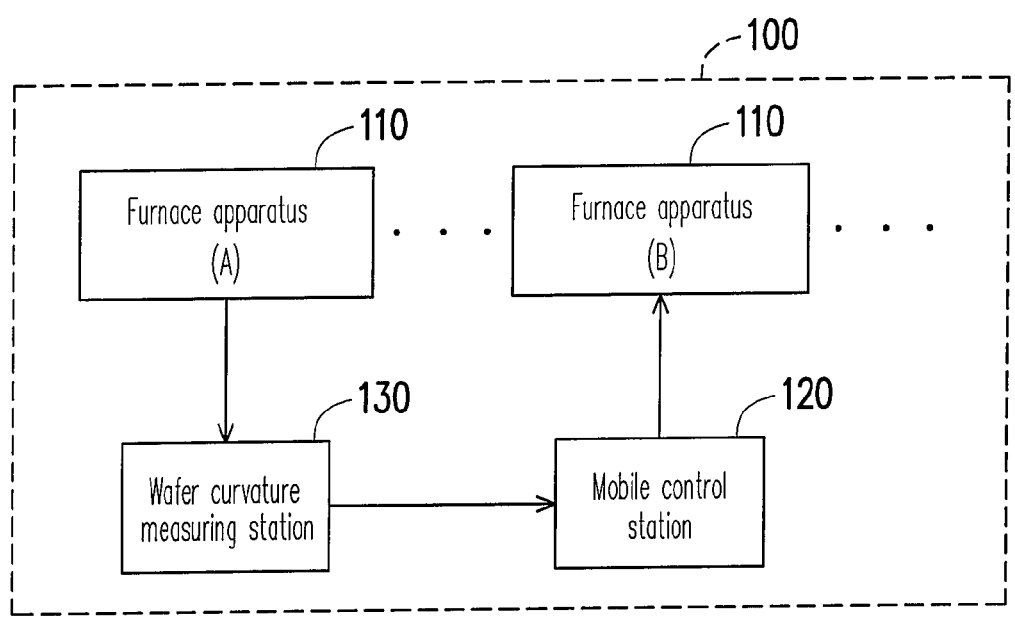
FIG. 1 is a schematic view illustrating an arrangement of a semiconductor apparatus system according to an embodiment of the present invention.

FIG. 1 is a schematic view illustrating an arrangement of a semiconductor apparatus system according to an embodiment of the present invention.

Referring to FIG. 1, a semiconductor apparatus system 100 includes at least a furnace apparatus 110 for performing a high temperature furnace process. Here, the so-called "high temperature furnace process" refers to a furnace process which is performed at a process temperature larger than or equal to 900° C. In the present embodiment, the semiconductor apparatus system 100 includes two furnace apparatuses 110, i.e. a furnace apparatus (A) and a furnace apparatus (B), for example. However, the number of the furnace apparatus is not limited in the present invention. Instead, the number of the furnace apparatus can be adjusted based on actual demands. Each of the furnace apparatuses 110 is mainly composed of a wafer boat carrying wafers and a furnace used for disposing the wafer boat therein. In addition, the furnace apparatus also includes a temperature controller, a gas delivery pipeline, and so forth. The arrangement and combination of the furnace apparatuses in normal semiconductor processes are well known to those skilled in the pertinent art, and thus no further description is provided hereinafter. In the present embodiment, the furnace apparatuses 110 may be thermal diffusion furnace apparatuses, a low-pressure chemical vapor deposition furnace apparatuses, or other furnace apparatuses adopted in the normal semiconductor process.

Figure 2A:
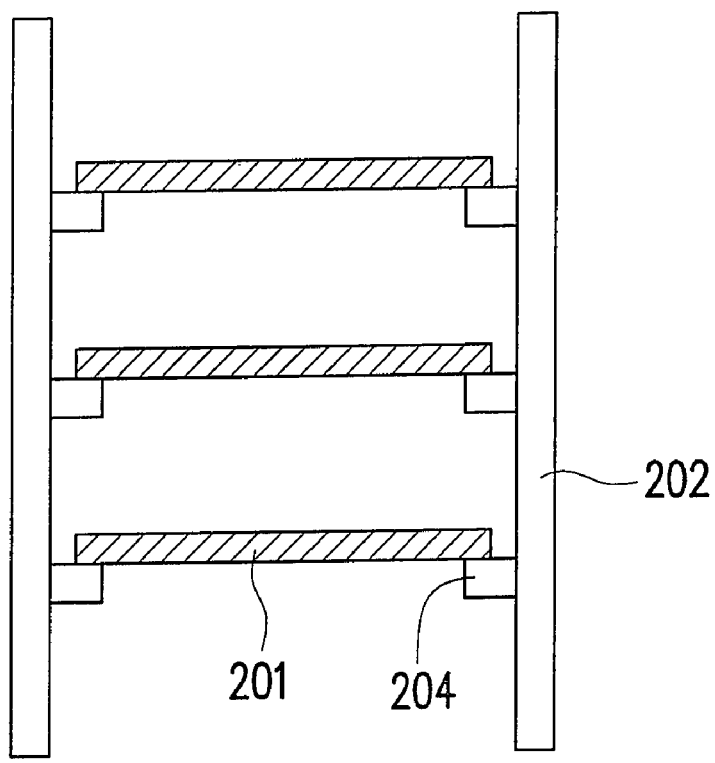
FIG. 2A is a schematic cross-sectional view illustrating a wafer boat.
Figure 2B:
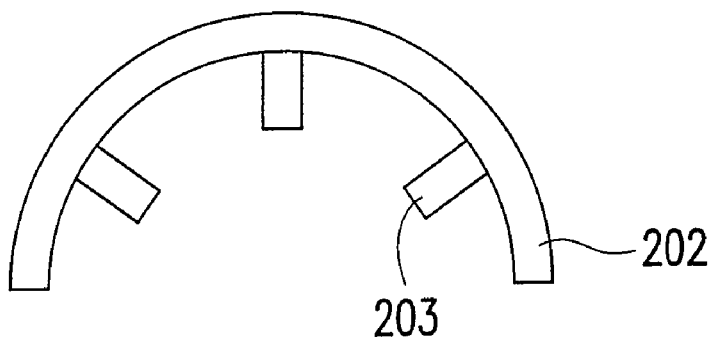
FIG. 2B is a schematic top view illustrating a wafer boat.
Figure 2C:
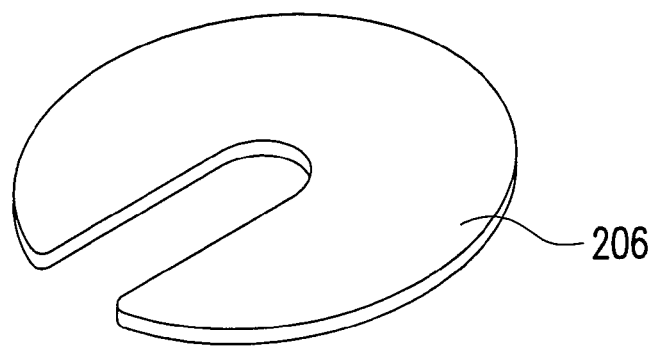
FIGS. 2C, 2D and 2E are schematic views illustrating a partition plate of a wafer boat.
Figure 2D:
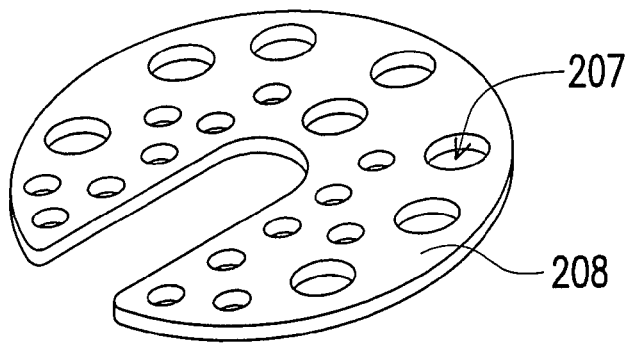
Figure 2E:
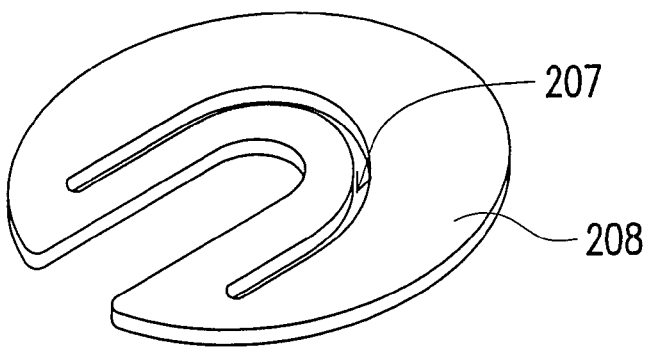

As shown in FIG. 2A, note that the wafer boat in each of the furnace apparatuses 110 may be a normal wafer boat used in semiconductor process. The wafer boat comprises a boat body 202 and several supporting parts 204 which are used to contact with wafers and disposed on each horizontal plane of the boat body 202, so as to divide the boat body 202 into a number of wafer slots on which wafers 201 can be disposed. The above-mentioned supporting part 204 comprises a plurality of pins (as shown 203 in FIG. 2B). It is certain that the supporting part 204 of the wafer boat of the furnace apparatuses 110 may also be a ring-shaped (an inverted U-shaped or a U-shaped) partition plate 206 (as shown in FIG. 2C) having an open hole at a side, or a partition plate 208 (as shown in FIGS. 2D and 2E) having at least one opening 207. A material of the wafer boat (the boat body 202 and the supporting part 204) of the furnace apparatuses 110 is, for example, quartz, silicon carbide (SiC), or any other appropriate material.

Moreover, the semiconductor apparatus system 100 further includes a mobile control station 120. The mobile control station 120 is coupled to one of the furnace apparatuses 110, such that a relative position of the wafer in the wafer boat is different when different high temperature furnace processes are performed. In detail, after completion of a first high temperature furnace process in the furnace apparatuses 110 but before an implementation of a next high temperature furnace process, the wafer boat carrying the wafers may be moved to the mobile control station 120, so as to change the relative position of the wafer in the wafer boat. Thereby, damages to the wafer due to the implementation of the first high temperature furnace process are not increased because of the implementation of the next high temperature furnace process.

Based on the above, the mobile control station 120 may rotate the wafer in the wafer boat at an angle on the same horizontal plane with use of a robot arm, so as to change the relative position of the wafer in the wafer boat, for example. In an alternative, the mobile control station 120 may change the relative position of the wafer in the wafer boat with use of a positioning device. Additionally, the relative position of the wafer in the wafer boat may also be changed by rotating the wafer boat. Based on the actual demands, people skilled in the pertinent art may change the relative position of the wafer in the wafer boat in the mobile control station through other embodiments according to the spirit of the present invention and the teachings of the aforesaid embodiments.

A conventional manufacturing process may cause the damages directly to a contacting area between the wafer and the wafer boat. In particular, the damages may be increased after a plurality of the high temperature furnace processes is implemented. Therefore, the mobile control station 120 additionally configured in the semiconductor apparatus system 100 can protect the wafers from being damaged, and stability of subsequent manufacturing processes, reliability of devices, and yield of the devices can also be avoided from being reduced.

Referring to FIG. 1, in another embodiment, the semiconductor apparatus system 100 further includes a wafer curvature measuring station 130. The wafer curvature measuring station 130 is coupled to the mobile control station 120 and to one of the furnace apparatuses 110 for determining a relative displacement amount of the wafer based on a measured value. A method of determining the relative displacement amount of the wafer based on the measured value of the wafer curvature includes measuring the wafer curvature at the wafer curvature measuring station and accessing to the mobile control station 120 for moving a relatively concave area of the wafer onto the supporting parts of the wafer boat. Based on the measured value of the wafer curvature, the relative displacement amount between the wafer and the wafer boat is properly adjusted. Thereby, stability and reliability of the subsequent processes of manufacturing the wafer can be further improved. As such, not only the severe damages to the wafer due to the implementations of a plurality of the high temperature furnace processes are precluded, but also stability and reliability of the subsequent manufacturing processes are enhanced by virtue of the additionally configured wafer curvature measuring station 130.

Figure 3:
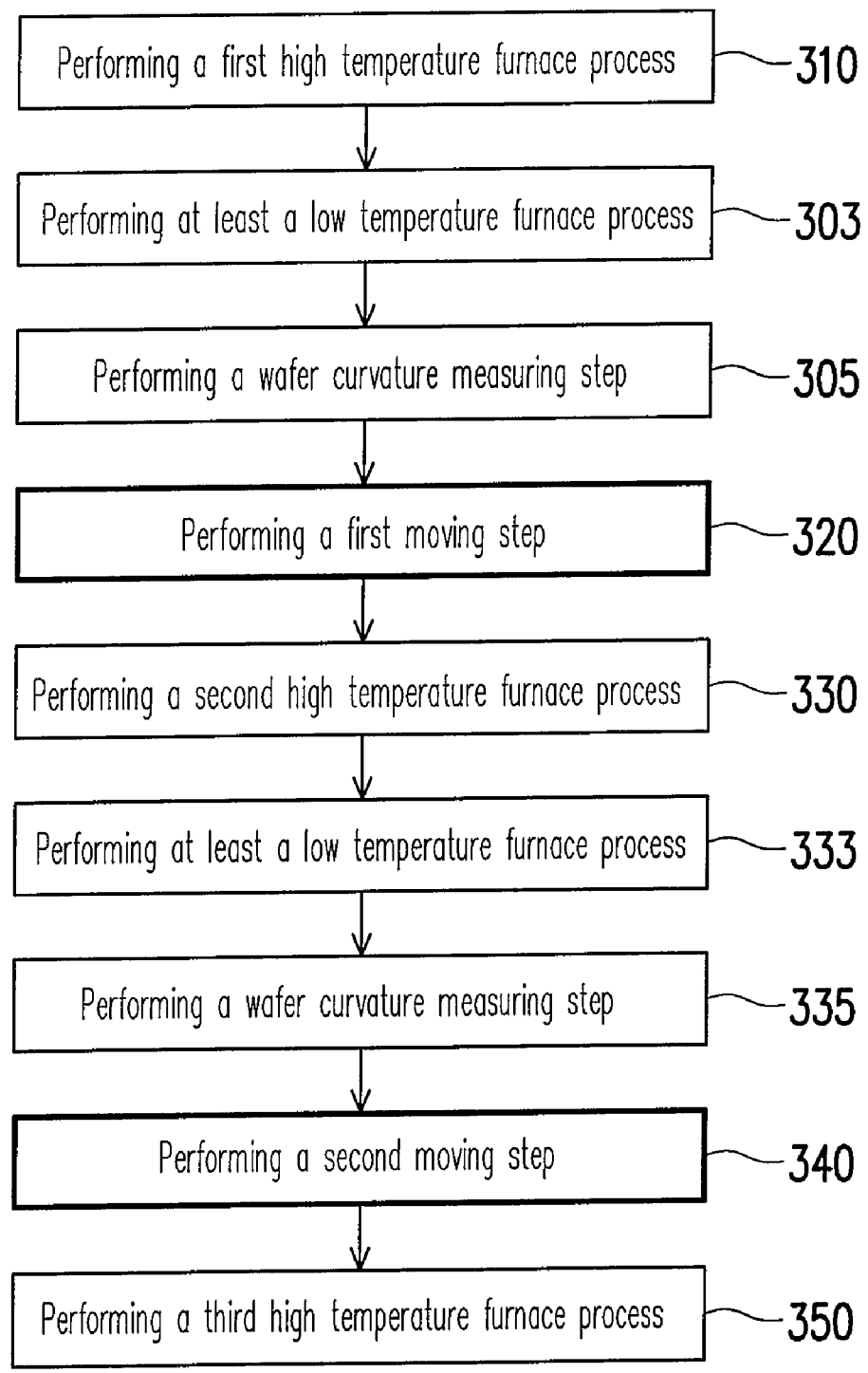
FIG. 3 is a flowchart illustrating a method of a semiconductor process according to an embodiment of the present invention.

The semiconductor apparatus system provided by the present embodiment is taken to elaborate a method of the furnace process hereinafter. FIG. 3 is a flowchart illustrating a method of a semiconductor process according to an embodiment of the present invention. In the following embodiment, the furnace apparatuses 110 consisting of the furnace apparatus (A) and the furnace apparatus (B) depicted in FIG. 1 are taken for performing the high temperature furnace process.

Figure 4A:
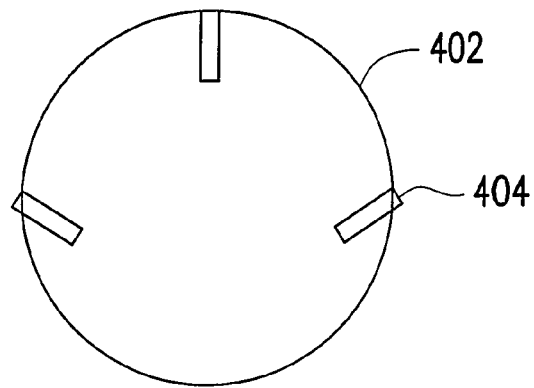
FIG. 4A is a schematic top view illustrating a wafer and pins in a wafer boat before a moving step is performed.

Referring to FIGS. 1 and 3, a first high temperature furnace process is implemented (step 310). A process temperature of the first high temperature furnace process is larger than or equal to 900° C. The first high temperature furnace process is performed by delivering the wafer boat carrying at least one wafer to the furnace apparatus (A) 110, for example. After relevant parameters are adjusted, the furnace process is then performed. In the present embodiment, the normal wafer boat is taken to demonstrate the disposition of the wafer in the wafer boat. FIG. 4A is a schematic top view illustrating the wafer 402 and pins 404 in the wafer boat. Certainly, other wafer boats aside from the conventional ones can also be adopted in the present invention. Since other embodiments of the wafer boat have been elaborated hereinbefore, further descriptions are omitted.

Figure 4B:
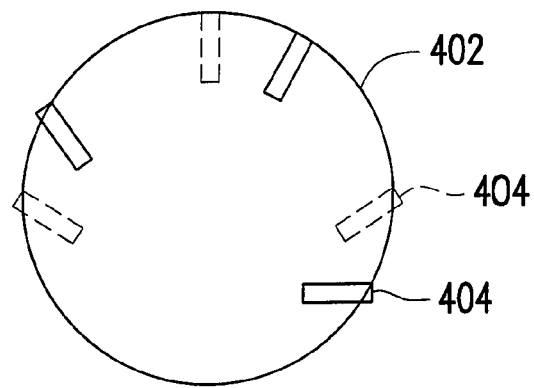
FIG. 4B is a schematic top view illustrating a wafer and pins in a wafer boat after a first moving step is performed.

Next, a first moving step is performed (step 320), so as to differentiate the relative position of the wafer in the wafer boat. For example, the first moving step includes moving the wafer boat carrying the wafer into the mobile control station 120 after the first high temperature furnace process is completed and collecting the wafer in the wafer boat with use of a robot arm. After the wafer is rotated at an angle on the same horizontal plane, the wafer is then placed into the same wafer boat or another wafer boat, so as to change the relative position of the wafer in the wafer boat. Besides, other embodiments have been provided hereinbefore to demonstrate how to change the relative position of the wafer in the wafer boat, and thus further descriptions are omitted. FIG. 4B is a schematic top view illustrating the wafer 402 and the pins 404 in the wafer boat after the first moving step is performed. In FIG. 4B, dotted lines (---) represent positions of the pins 404 in the wafer boat. The pins 404 are disposed on the wafer 402 before the first moving step is performed.

After that, a second high temperature furnace temperature is implemented (step 330), and a process temperature of the second high temperature furnace temperature is larger than or equal to 900° C. Besides, the second high temperature furnace process is performed by delivering the wafer boat from the mobile control station 120 to the furnace apparatus (B) 110, for example. Here, the relative position of the wafer in the wafer boat has been changed. After the relevant parameters are adjusted, the furnace process is then performed.

In one embodiment, at least a low temperature furnace process may be performed (step 303) between completion of the first high temperature furnace process (step 310) and the implementation of the second high temperature furnace process (step 330). The damages to the wafer may merely be increased due to the high temperature. Hence, before the low temperature furnace process is performed, it is not required to change the relative position of the wafer in the wafer boat.

In addition, the relative position of the wafer in the wafer boat is changed before the high temperature furnace process is performed. Namely, in each of the high temperature furnace processes, the contacting areas between the wafer and the wafer boat are not the same. As such, the damages to a certain area on the wafer can be prevented from being increased because of the implementations of a plurality of the high temperature furnace processes.

Moreover, referring to FIGS. 1 and 3, in one embodiment, a wafer curvature measuring step may be performed (step 305) before the first moving step is performed (step 320), and the relative displacement amount of the wafer can be determined upon the measured value of the wafer curvature. For example, the wafer curvature measuring step is implemented by moving the wafer boat carrying the wafer into the wafer curvature measuring station 130 before entering the mobile control station 120. Next, a measurement is conducted through a method of measuring the wafer curvature in the normal semiconductor manufacturing process. After that, the relative position of the wafer in the wafer boat is adjusted at the mobile control station 120 based on the measured value of the wafer curvature. The above method of measuring the wafer curvature is well known to those skilled in the pertinent art, and thus no further descriptions are provided hereinafter.

Figure 4C:
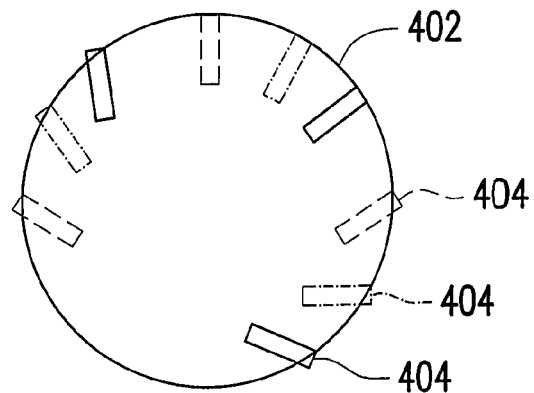
FIG. 4C is a schematic top view illustrating a wafer and pins in a wafer boat after a second moving step is performed.

Thereafter, referring to FIG. 3, a third high temperature furnace process may be performed (step 350) after the implementation of the second high temperature furnace process (step 330). A process temperature of the third high temperature furnace process is larger than or equal to 900° C. However, before the third high temperature furnace process is performed (step 350), it is required to implement a second moving step (step 340) at first, so as to differentiate the relative position of the wafer in the wafer boat. Thereby, the damages to the wafer are no longer increased, thus preventing a decrease in stability of the subsequent manufacturing processes and reliability of the devices. FIG. 4C is a schematic top view illustrating the wafer 402 and the pins 404 in the wafer boat after the second moving step is performed. In FIG. 4C, the dotted lines (---) represent the positions of the pins 404 on the wafer 402 before the first moving step is performed. On the other hand, the chain lines (-•-•-) represent the positions of the pins 404 on the wafer 402 after the first moving step is performed.

Likewise, at least one low temperature furnace process may be performed (step 333) between completion of the second high temperature furnace process (step 330) and the implementation of the third high temperature furnace process (step 350). Moreover, in one embodiment, one wafer curvature measuring step may be performed (step 335) before the second moving step is performed (step 340), and the relative displacement amount of the wafer can be determined upon the measured value of the wafer curvature.

To sum up, according to the present invention, the relative position of the wafer in the wafer boat is changed before the next high temperature furnace process is performed, so as to avoid the severe damages to the wafer on account of the implementation of the previous high temperature furnace process. Besides, the present invention can also determine the relative displacement amount of the wafer by measuring the wafer curvature, so as to further improve reliability of the manufacturing process and yield of the devices.

Although the present invention has been disclosed above by the embodiments, they are not intended to limit the present invention. Anybody skilled in the pertinent art can make some modifications and alteration without departing from the spirit and scope of the present invention. Therefore, the protecting range of the present invention falls in the appended claims.

What is claimed is:

1. A method of a semiconductor process at least comprising a first high temperature furnace process and a second high temperature furnace process, the method comprising:
    performing the first high temperature furnace process on a first wafer boat carrying at least a wafer; and
    performing the second high temperature furnace process on a second wafer boat carrying at least the same wafer, wherein before the second high temperature furnace process is implemented, a first moving step is performed, such that positions of the wafer relative to wafer supporting parts in the first wafer boat and in the second wafer boat are different, in which the wafer is rotated at an angle on a horizontal plane and placed into the second wafer boat.

2. The method of claim 1, wherein the first moving step is performed by rotating the wafer at an angle on the same horizontal plane with use of a robot arm.

3. The method of claim 1, wherein the first moving step is performed by changing the relative positions of the wafer in the first wafer boat and in the second wafer boat with use of a positioning device in a furnace apparatus.

4. The method of claim 1, wherein the first moving step is performed by changing the relative positions of the wafer in the first wafer boat and in the second wafer boat through rotations of the first and the second wafer boats.

5. The method of claim 1, wherein a process temperature of the first high temperature furnace process and a process temperature of the second high temperature furnace process are larger than or equal to 900° C.

6. The method of claim 1, further comprising performing at least a furnace process with a process temperature lower than 900° C. after the first high temperature furnace process is performed but before the first moving step is performed.

7. The method of claim 1, wherein the first wafer boat comprises a boat body and a supporting part which are used to contact with wafers and disposed on each horizontal plane of the boat body, and the supporting part comprises a plurality of pins, a ring-shaped partition plate having an open hole at a side, or a ring-shaped partition plate having an open hole at a side and at least one opening.

8. The method of claim 1, wherein a material of the first wafer boat comprises quartz or silicon carbide (SiC).

9. The method of claim 1, wherein the second wafer boat and the first wafer boat are the same or different.

10. The method of claim 1, further comprising performing a wafer curvature measuring step before the first moving step is performed, a relative displacement amount of the wafer being determined upon a measured value obtained through performing the wafer curvature measuring step.

11. The method of claim 1, further comprising performing a third high temperature furnace process on a third wafer boat carrying at least the wafer after the second high temperature furnace process is implemented, and performing a second moving step before the third high temperature furnace process is performed, such that the relative positions of the wafer in the first wafer boat, in the second wafer boat, and in the third wafer boat are different.

12. The method of claim 11, wherein the second moving step and the first moving step are the same or different.

13. The method of claim 11, further comprising performing at least a furnace process with a process temperature lower than 900° C. after the second high temperature furnace process is performed but before the second moving step is performed.

14. The method of claim 11, wherein a process temperature of the third high temperature furnace process is larger than or equal to 900° C.

15. The method of claim 11, wherein the third wafer boat and the second wafer boat are the same or different.

16. The method of claim 11, further comprising performing a wafer curvature measuring step before the second moving step is performed, a relative displacement amount of the wafer being determined upon a measured value obtained through performing the wafer curvature measuring step.

17. A semiconductor apparatus system, comprising:
- at least a furnace apparatus for performing a high temperature furnace process, the furnace apparatus comprising a wafer boat used for carrying at least a wafer; and
- a mobile control station coupled to the furnace apparatus for differentiating a relative position of the wafer in the wafer boat when different high temperature furnace processes are performed, wherein the position of the wafer relative to wafer supporting parts in the wafer boat is changed by rotating the wafer in the mobile control station, in which the wafer is rotated at an angle on a horizontal plane and then placed into the same wafer boat or another wafer boat.

18. The semiconductor apparatus system of claim 17, further comprising a wafer curvature measuring station coupled to the furnace apparatus and the mobile control station for determining a relative displacement amount of the wafer based on a measured value.

19. The semiconductor apparatus system of claim 17, wherein the wafer is rotated at an angle on the same horizontal plane with use of a robot arm in the mobile control station.

20. The semiconductor apparatus system of claim 17, wherein the relative position of the wafer in the wafer boat is changed with use of a positioning device in the mobile control station.

21. The semiconductor apparatus system of claim 17, wherein a process temperature of the high temperature furnace process is larger than or equal to 900° C.

22. The semiconductor apparatus system of claim 17, wherein the wafer boat comprises a boat body and a supporting part which are used to contact with wafers and disposed on each horizontal plane of the boat body, and the supporting part comprises a plurality of pins, a ring-shaped partition plate having an open hole at a side, or a ring-shaped partition plate having an open hole at a side and at least one opening.

23. The semiconductor apparatus system of claim 17, wherein a material of the wafer boat comprises quartz or silicon carbide (SiC).

* * * * *